US008861200B2

(12) United States Patent
Malmberg

(10) Patent No.: US 8,861,200 B2
(45) Date of Patent: Oct. 14, 2014

(54) MODULE FOR A TELECOMMUNICATIONS SUBRACK AND A TELECOMMUNICATIONS SUBRACK

(75) Inventor: Gunnar Malmberg, Vendelso (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 579 days.

(21) Appl. No.: 13/141,912

(22) PCT Filed: Dec. 23, 2008

(86) PCT No.: PCT/SE2008/051561
§ 371 (c)(1),
(2), (4) Date: Aug. 9, 2011

(87) PCT Pub. No.: WO2010/074623
PCT Pub. Date: Jul. 1, 2010

(65) Prior Publication Data
US 2011/0286176 A1   Nov. 24, 2011

(51) Int. Cl.
*H05K 7/20* (2006.01)
*H05K 5/00* (2006.01)

(52) U.S. Cl.
CPC .................................. *H05K 7/20581* (2013.01)
USPC ............................ 361/695; 454/184; 417/360

(58) Field of Classification Search
CPC .. H01L 23/46; H01L 23/467; H05K 7/20581; H05K 7/20136; H05K 7/20172; H05K 7/20554; H05K 7/20563; H05K 7/20718; H05K 7/20727; H05K 7/20736
USPC ........ 361/679.46–679.54, 688–723; 454/184; 417/360; 385/135
See application file for complete search history.

(56) References Cited

U.S. PATENT DOCUMENTS 5,210,680 A   5/1993 Scheibler 5,999,403 A   12/1999 Neustadt
(Continued)

FOREIGN PATENT DOCUMENTS

CN          2519503 Y    10/2002
CN        101321447 A    12/2008

OTHER PUBLICATIONS

Chinese First Office Action Corresponding to Chinese Patent Application No. 200880132533.8; Date of Issue: Aug. 21, 2013; Foreign Text, 5 Pages, English Translation Thereof, 8 Pages.

(Continued)

*Primary Examiner* — Zachary M Pape
(74) *Attorney, Agent, or Firm* — Myers Bigel Sibley & Sajovec, PA

(57) ABSTRACT

A module for a telecommunications subrack as well as a telecommunication subrack are disclosed. The module is a horizontal plug in unit including a power part that includes power filtering functions for securing power feed to a backplane of the subrack as well as to a number of fans also arranged on the module for cooling of the subrack. The module also includes connectors arranged in the rear of the module for connecting the module to the backplane as well as connectors arranged in the front of the module for accommodating power cables. The telecommunications subrack includes a cage configured to accommodate cards, an air intake with filter and two or more removably mounted modules. Each of these modules includes a power part that includes power filtering functions for securing power feed for the subrack, input connectors arranged in the front of the module for accommodating power cables, fans for cooling of the subrack, and output connectors for connecting the module to a backplane of the subrack. The subrack further includes a backplane configured to distribute power and signaling to the cards and having connectors for connecting to the modules.

14 Claims, 8 Drawing Sheets

(56) References Cited

U.S. PATENT DOCUMENTS

| | | | |
|---|---|---|---|
| 6,388,880 B1 * | 5/2002 | El-Ghobashy et al. | 361/695 |
| 7,729,116 B1 * | 6/2010 | Aybay et al. | 361/695 |
| 8,068,340 B1 * | 11/2011 | Nguyen et al. | 361/695 |
| 2003/0221817 A1 | 12/2003 | Smith et al. | |
| 2005/0162836 A1 | 7/2005 | Briggs et al. | |
| 2006/0237208 A1 * | 10/2006 | Mangold | 174/50 |
| 2009/0109619 A1 * | 4/2009 | Wise et al. | 361/695 |

OTHER PUBLICATIONS

International Search Report, PCT Application No. PCT/SE2008/051561, Jun. 8, 2009 (4 pages).

Written Opinion Of The International Searching Authority, PCT Application No. PCT/SE2008/051561, Jun. 8, 2009, (5 pages).

* cited by examiner

MODULE FOR A TELECOMMUNICATIONS SUBRACK AND A TELECOMMUNICATIONS SUBRACK

CROSS REFERENCE TO RELATED APPLICATIONS

This application is a 35 U.S.C. §371 national stage application of PCT International Application No. PCT/SE2008/051561, filed on 23 Dec. 2008, the disclosure and content of which is incorporated by reference herein in its entirety. The above-referenced PCT International Application was published in the English language as International Publication No. WO 2010/074623 A1 on 1 Jul. 2010.

TECHNICAL FIELD

The present invention relates to module for a telecommunications subrack as well as a telecommunication subrack.

BACKGROUND

Telecommunication subracks are equipped with power feeding boards for securing power feed to the backplane for further distribution to the cards and for supplying power to cooling fans, etc. A known solution is to provide vertically arranged power feeding boards in the card cage, at each side of the subrack, left and right, to achieve a redundant feeding.

Usually two separate fan units are arranged to cool the subrack, one at the top and one at the bottom to achieve a redundant cooling. The power is provided from the power feeding boards to each fan unit via power cables originating from the front of the power feeding board, taking up connector space on the front of the power feeding boards. Since more and more power is needed to feed subracks, the connector space at the front of the power feeding boards as well as the area for components on the power feeding boards is becoming a rare asset. The power cables can also originate from an external power source and be directly connected to the fan units.

Another solution is to provide the power feeding boards further back in the subrack. That way the problem with cables in front of the subrack is diminished. However, provision of a power feeding board behind the front of the subrack, for example from the back of the subrack, makes it less accessible and, consequently, more difficult to connect components to the power feeding board. Further, if the power feeding board is large, the shape of other, adjacent components must be modified in order to fit in the subrack.

It is therefore a desire for a subrack with a power feeding board of sufficient size and number of connectors to meet the ever increasing power need, at the same time as the power feeding board is easily accessible and replaceable.

SUMMARY

In accordance with the present invention, a module for a telecommunication subrack is provided. The module is configured to be removably mounted, i.e. a so called plug in unit, in a preferably horizontal fashion in the subrack and is composed of a power part including power filtering functions for securing power feed to a backplane of the subrack. The power part also provides power to a number of fan assemblies arranged on the module for cooling of the subrack. The module also comprises output connectors arranged in the rear of the module for connecting the module to the backplane as well as input connectors arranged in the front of the module for accommodating power cables.

An advantage is thereby that the module eliminates the need of external power cables between the power feeding board and the fan units. Further, connector space is increased at the same time as the power part of the module is easily accessible.

In accordance with the present invention, there is also provided a telecommunication subrack. The subrack comprises a cage configured to accommodate cards, an air intake provided with a filter and two or more removably mounted modules. Each of these modules comprises a power part including power filtering functions for securing power feed for the subrack, one or more fan assemblies for cooling of the subrack, one or more input connectors arranged in the front of the module for accommodating power cables, and one or more output connectors for connecting the module to a backplane of the subrack. The subrack further comprises a backplane configured to distribute power and signaling to the cards and having input connectors for connecting to said two or more modules.

Accordingly, the advantage of complete redundancy regarding power feeding and subrack cooling is provided achieving easy handling and maintenance of the subrack regarding cooling and power feed.

Each module is preferably configured to feed the subrack with sufficient power and cooling and it is therefore no need to shut down the subrack when replacing modules during maintenance as long as at least one module is positioned in the subrack.

The invention will now be more closely described with the aid of embodiments and with reference to enclosed drawings.

DETAILED DESCRIPTION

Figure 1:
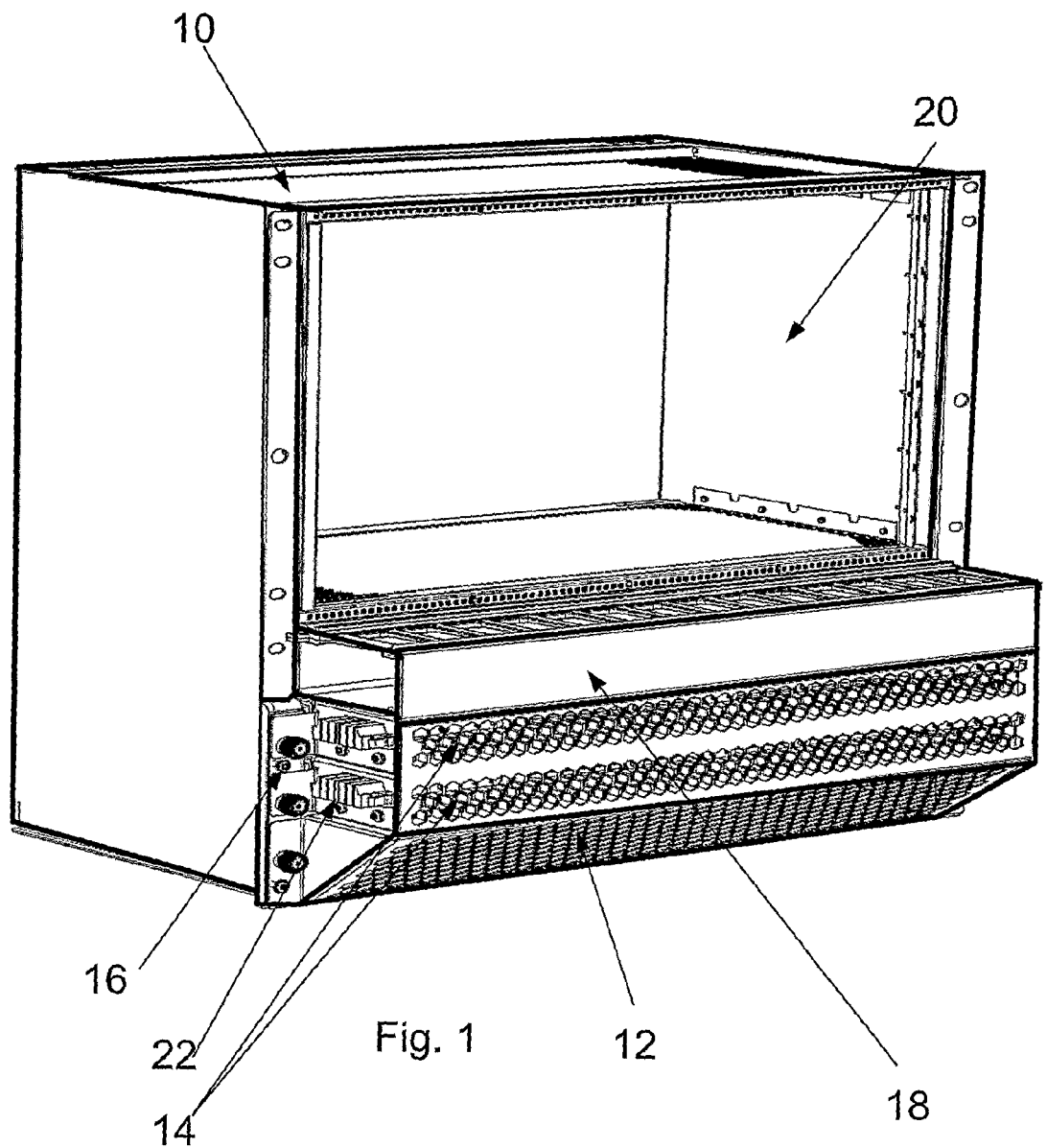
FIG. 1 is a perspective view of a subrack including two modules according to embodiments of the present invention.

FIG. 1 is a perspective view of a subrack 10 including two modules according to an embodiment of the present invention. In the bottom part an air intake 12 is arranged. Above the air intake 12, two modules 14 are arranged, the modules including a power part for the subrack, one or more fans for cooling of the subrack and connectors arranged in the rear of the module for connecting the module to a backplane of the subrack. The modules 14 are preferably kept in place by screw or snap connections 16 and by rails or grooves or similar arrangements provided in the walls of the modules 14 and/or the subrack 10. On the side of the modules 14 power connectors 22 are provided for connecting incoming power feeding cables to the module. Above the modules 14 is a cable shelf 18 provided. Above the cable shelf 18, a card cage 20 is provided for accommodating a number of horizontally and/or vertically arranged plug-in-units containing circuit boards. In this embodiment the number of cards is 28. Each of the cards may be configured with any number of electronic components to accommodate the necessary functionality required. Such electronic components may include, but are not limited to, microprocessors, chip sets, memory, etc. The number of components means that the cards can generate a substantial amount of heat that must be dissipated in order to maintain the microelectronic components at an accepted operating temperature. The heat is dissipated by the fans provided on the module 14.

According to this embodiment the height of the complete subrack will be 500 mm. The subrack will occupy 12 U=533.34 mm mounted in a 19" cabinet. Three subracks mounted on top of each other will leave room for other equipment in a cabinet being 1800 mm high. The air intake 12 is 70 mm high, the two modules 14 are 40 mm each, the cable shelf 18 is 50 mm and the card cage is 300 mm. The total subrack depth will be 325 mm, 240 mm behind the cabinet mounting flange and 85 mm protrusion of the cable shelf 18 and the modules 14.

Figure 2:
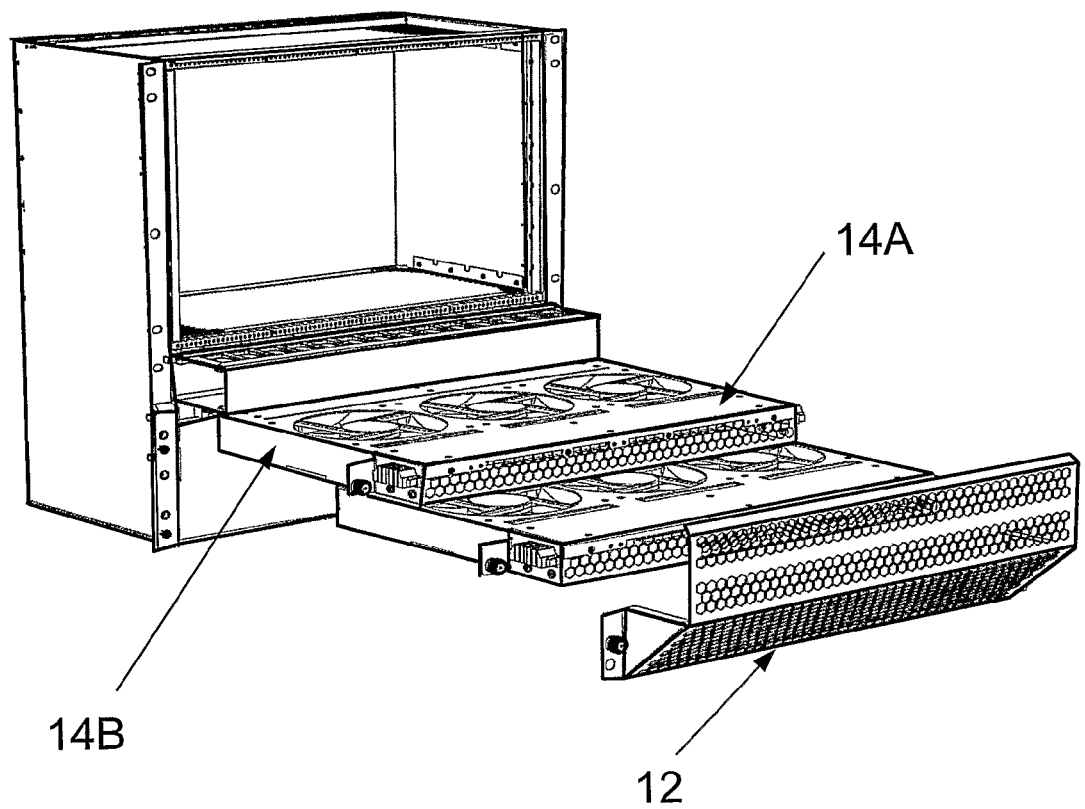
FIG. 2 is an exploded view of the subrack in FIG. 1.

FIG. 2 is an exploded view of the subrack in FIG. 1. As can be seen, the air intake 12 extends both vertically and horizontally along the entire front of the modules 14. Below the modules 14, the air intake 12 is angled from its protruded level to the level of the subrack 10. Front parts or power parts 14A of the modules 14 accommodate the power feeding components, for the subrack 10. Behind the power part a section 14B including three fans with fan motors; a fan assembly, is accommodated for cooling of the subrack 10. The fans draw air into the subrack 10 via the air intake 12, which preferably is provided with an air filter for stopping large particles from entering the subrack 10. Thereafter the air is lead through, or over, the cards that may be accommodated in the card cage and exits the subrack through the top of the subrack. A fan assembly includes at least one fan and means for driving the fan, e.g. a motor.

The power part 14A include input power connectors 22 for connecting the module 14 to an external power supply that feed the module with power sufficient for the entire subrack 10. The power part 14A further comprises power feeding components, including but not limited to power filtering functions. These power filtering functions demands a lot of space and is necessary for taking care of disturbances and transients. The power filtering functions will contain specific circuitry which can filter out electrical noise and other corrupting signals coming from the external electrical power supply. The power part may also include power surge functions for damping out high voltage transients to prevent damage to any or all appliances connected to the power part.

According to an embodiment of the invention the power part of the module includes Current Limiting Devices (CLDs). These CLDs are arranged in parallel making it possible to feed each subrack with the combined power from all the incoming branches, without having a backplane divided into separate sections, i.e. the backplane is made up of one single section with one single bus. In previous solutions, without the CLDs, the backplane consist of a number of separate sections corresponding to the number of incoming branches. The move of the power part into the fan assembly leads to an increase in area/space for the power part making it possible to drastically increase the incoming power from external source(s), meeting the always present need to feed the subrack with more power.

Both of the two modules 14 are easily removed from the subrack 10. The capacity of each module 14 is enough to both feed the subrack with power and to cool the subrack. During a failure or for maintenance on one of the modules 14 it is therefore possible to change and replace the module without any significant disturbance of the subrack, as long as at least one module is still positioned in, and connected to, the subrack.

Compared to previous solutions the power part is moved from the sides, or the interior, of the subrack to the modules 14 according to the present invention. The subrack is thus provided with power to the backplane via the fan part. Thereby the fan assembly and the power feeding board (power part) are combined to a power and fan module. Usually two modules are required to get a redundant subrack. The capacity of each module 14 is enough to both feed the subrack with power and to cool the subrack. During a failure it is thereby possible to change and replace one of the two modules 14 without any disturbances of the subrack.

According to the present invention, the functions for High Ohmic Distribution (HOD) or Low Ohmic Distribution (LOD) can be incorporated in the modules 14. If there is a wish to, for example, change power feeding principle from HOD to LOD, this is easily accomplished by merely replacing the modules 14, one at a time, with a new module adapted for LOD. In known solutions the space on the power feeding boards are very limited, with regard to both area and height, and since HOD and LOD functions require a significant area space as well as height; the HOD or LOD functions had to be placed on separate external devices.

Figure 3A:
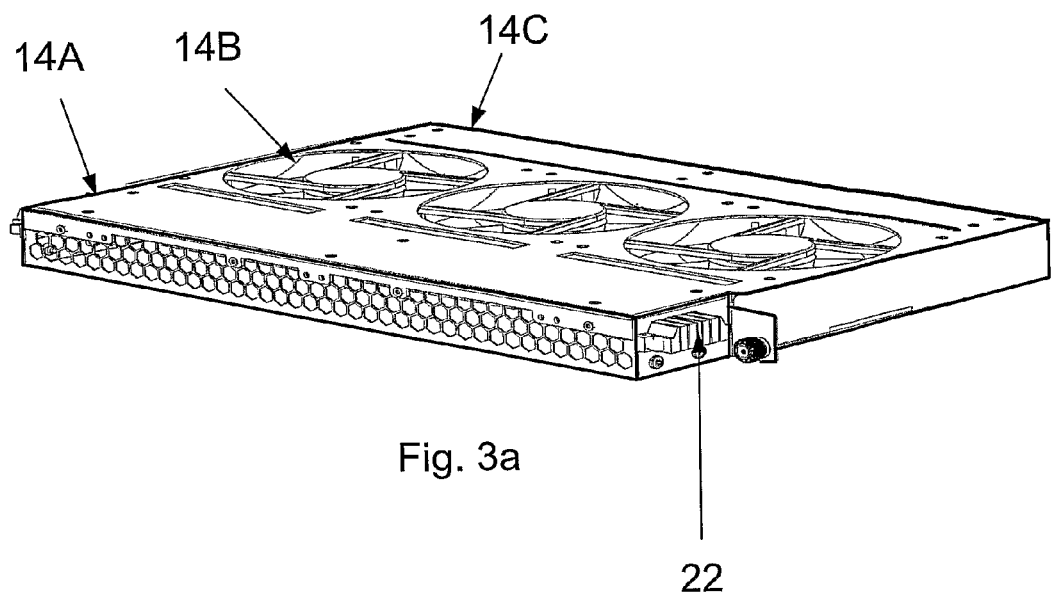
FIG. 3a is a perspective view of a module according to a first embodiment of the present invention.
Figure 3B:
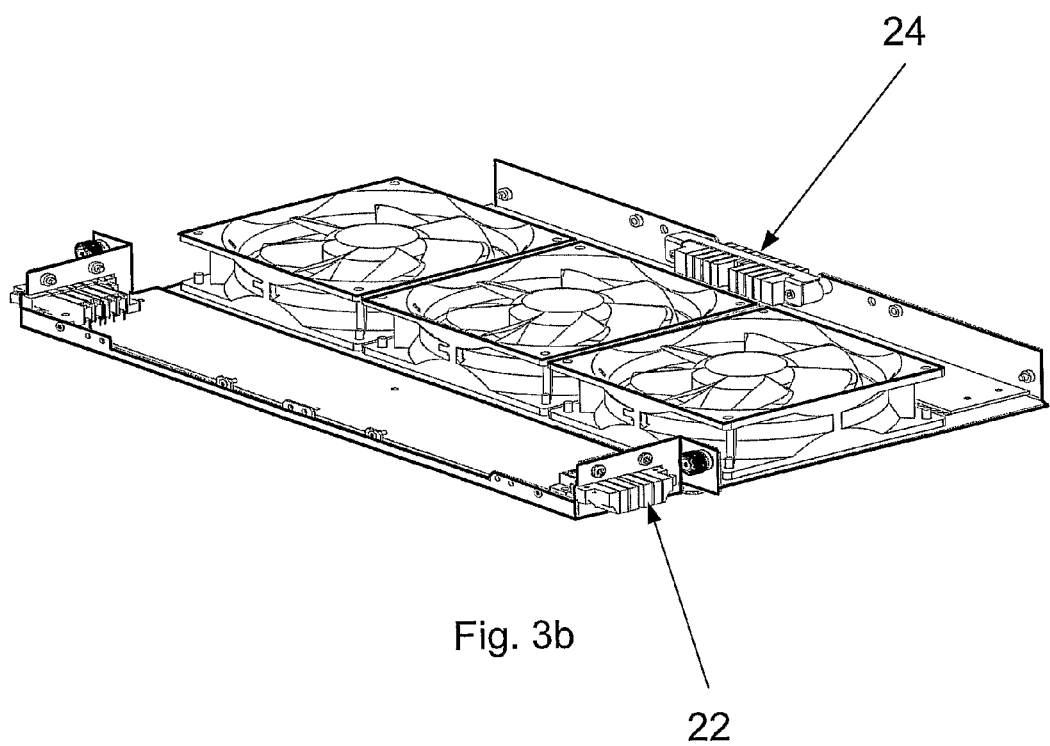
FIG. 3b is a perspective view showing the inside of a module according to a first embodiment of the present invention.

FIGS. 3a and 3b are perspective views of a module, respectively with and without the upper casing, according to an embodiment of the present invention. In this embodiment the module consist of essentially three parts: a power part 14A, a fan assembly 14B and a connector part 14C. The power part (or front part) 14A comprises at least the power filtering functions previously mentioned. The fan assembly 14B comprises three fans 25 for cooling of the subrack including three fan motors, but any number of fans could be chosen depending on e.g. size, cost and effect. The number of fan motors is also arbitrary even though one motor per fan is preferable. The connector part (or rear part) 14C comprises one or more output power connectors for connecting the module to a backplane of the subrack. The connector part 14C thereby transmits power to all the cards in the card cage 20 of the subrack 10. The connector part 14C preferably also comprises one or more signal connectors or signal pins for alarm and supervision.

The three parts 14A-C are arranged such that the front part provides power to the backplane via the rear part. The front part can provide power directly to the fan assembly or via the rear part for further distribution to the fan part. In this embodiment the front part 14A and the rear part 14C are essentially circuit boards and the fan assembly 14B comprises fans 25 that are passively power fed from the front 14A and/or the rear part 14C. One or more connectors 22 for accommodating power cables coming from external power source(s) are arranged to the side of the front part 14A. According to an embodiment the input connectors 22 each consist of four power and four signal contacts with one sense pin. These connectors 22 are to be attached to corresponding mating connectors from power cables coming from external power sources. In the rear of the module 14 one or more output connectors 24 are arranged for connecting the module 14 to a backplane of a subrack. According to an embodiment the connector 24 consist of a connector/cable-assembly with eight power and twelve signal contacts with one sense pin. Connector(s) 24 are to be attached to corresponding connector(s) on the backplane, preferably by press-fit connections or similar so that the module 14 can be easily and removably mounted to a subrack. In this embodiment the rear part 14C comprises a control unit for controlling the fan assembly 14B. However, this control unit can be positioned in other parts of the module even though it is preferable to place it close to the fans.

Figure 4:
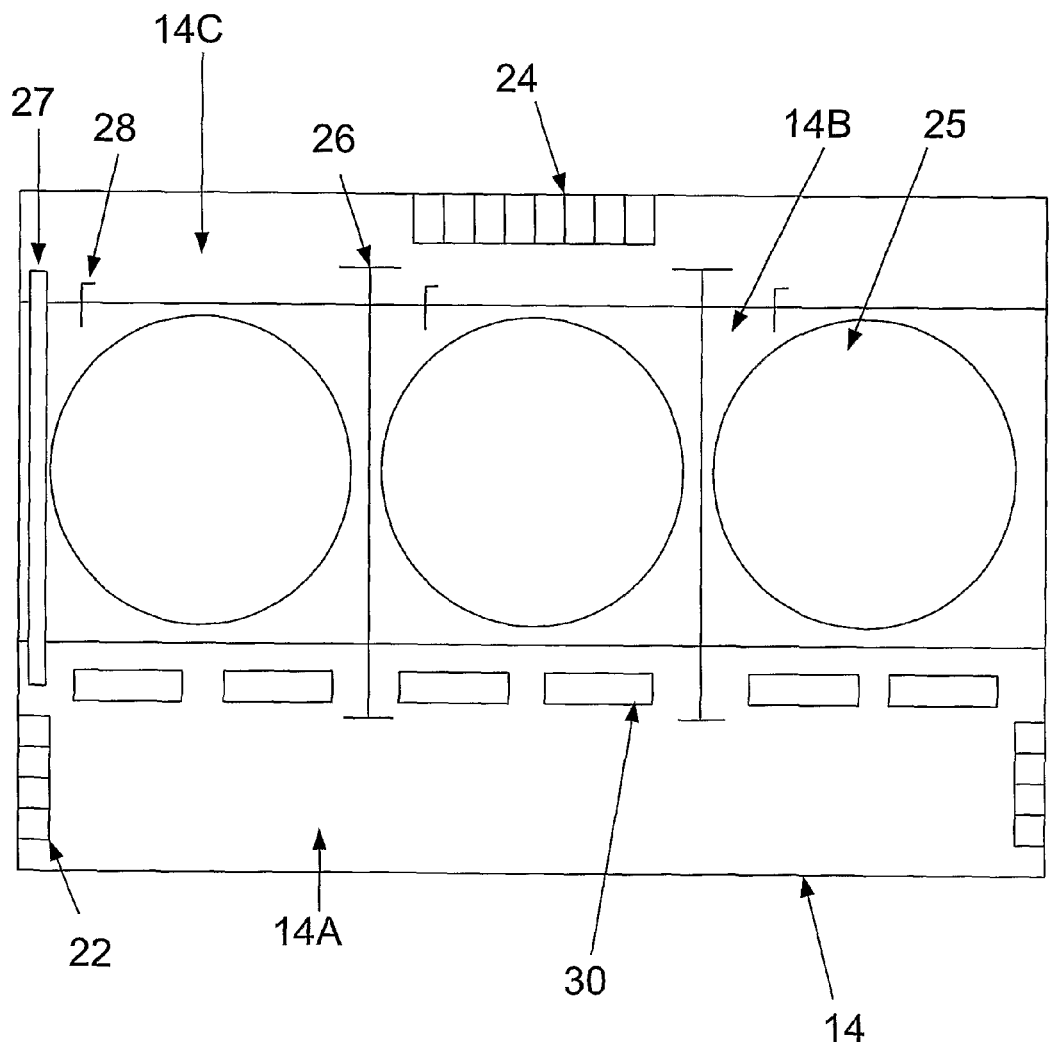
FIG. 4 is a schematic section view of a module according to a first embodiment of the present invention.

FIG. 4 is a schematic view of a module 14 as described with reference to the previous FIGS. 1-3. FIG. 4 shows two power connections 26 between the front part 14A and the rear part 14C. The power connections 26 can e.g. be power cables or busbars arranged in the interior of the fan assembly 14B. Signal connections 27 can e.g. be a ribbon cable assembly consisting of a number of flat signal cables that are connected to a signal connector on each part of the module that is to be connected. The fans 25 are in this embodiment connected to the rear part 14C by signal connectors 28 including a number of signal pins per connector. The fan assembly 14B can also be connected directly to the front part 14A without going via the rear part 14C. In this embodiment the rear part 14C includes a control unit for controlling the fans 25. In the front part 14A a number of holes 30 or ventilation openings are arranged. These holes can be of any suitable size, position and number. The purpose of the holes 30 is to increase the cooling of the heat generating components in the power part. The holes 30 sees to that some of the air flow from the fans 25 are lead via the power part 14A, providing a cooling effect.

All connections between various parts 14A-C of the module 14 are preferably arranged within the interior of the module. Preferably, the different parts 14A-C of the module 14, i.e. the entire module 14, is incorporated within a common enclosure. The enclosure is preferably made of metal sheets.

Figure 5:
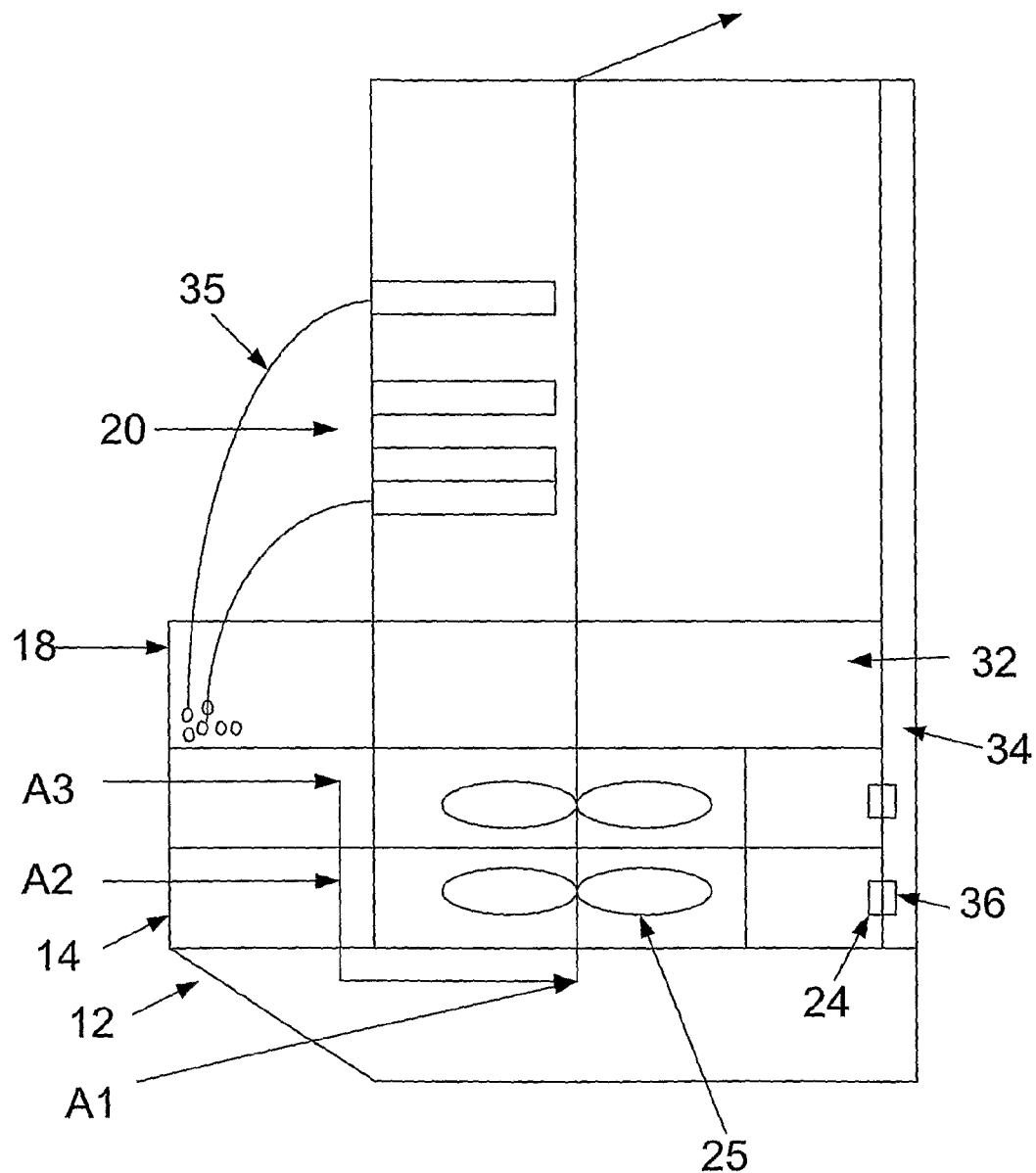
FIG. 5 is a schematic section view of a subrack according to embodiments of the present invention.

FIG. 5 is a schematic section view of a subrack according to an embodiment of the present invention. The subrack 10 includes two modules 14 arranged adjacent to one another. The majority of the air intake, see arrow A1, takes place through the air intake 12 with filter, being angularly arranged in the bottom part of the subrack 10. Further air intake, A2 and A3, is being made through the power part arranged in the front parts of the modules 14. The air is lead into the power parts from the front, lead over the heat generating circuits and thereafter downwards through holes 30 provided in the bottom of the power parts. By arranging the modules 14 adjacent to one another the cooling of the power part is enhanced. In particular the lower module will benefit from the airflow A3. If the upper module is removed from the subrack, an air valve, a flap or similar arrangement (not shown) provided in the subrack will pivot, or fall, down and block any air leakage from the lower module to ensure that the air flow is directed up through the interior of the subrack 10 and out. It is however not necessary to arrange the two modules adjacent to one another, e.g. one module can be arranged at the bottom or lower part of the subrack whereas one module is arranged in the top or upper part of the subrack; however then the above mentioned benefits will not be taken advantage of. The number of modules 14 is also not limited to two per subrack, even though more power/fan-modules 14 would take up unnecessary space. If other subracks are stacked above the subrack 10, the outgoing air will be lead behind the above arranged subracks. Behind the cable shelf 18 is a pressure equalizing part 32 arranged. The pressure equalizing part 32 is merely an empty space behind the cable shelf 18. This empty space helps in evenly distributing the cooling air coming from the fans 25 so that all cards receive approximately the same cooling. In the back of the subrack a backplane 34 is arranged. Since the power part according to the present invention preferably is provided in a lower position compared to known solutions, the backplane 34 will consequently be extended downwards in order to connect to the modules 14. Cables 35 from the cards are assembled in the cable shelf 18 and are e.g. optical or galvanic signal cables securing the communication between the cards and other parts of a telecommunication platform. The backplane 34 is provided with connectors 36 for mating with corresponding connectors 24 provided in the rear of the modules 14. The function of the backplane 34 is to provide power to all of the cards in the card cage 20. Further the backplane maintains the communication between the cards by e.g. Ethernet or buses. The power in the backplane is e.g. 2400 W and the voltage e.g. 48V.

Figure 6:
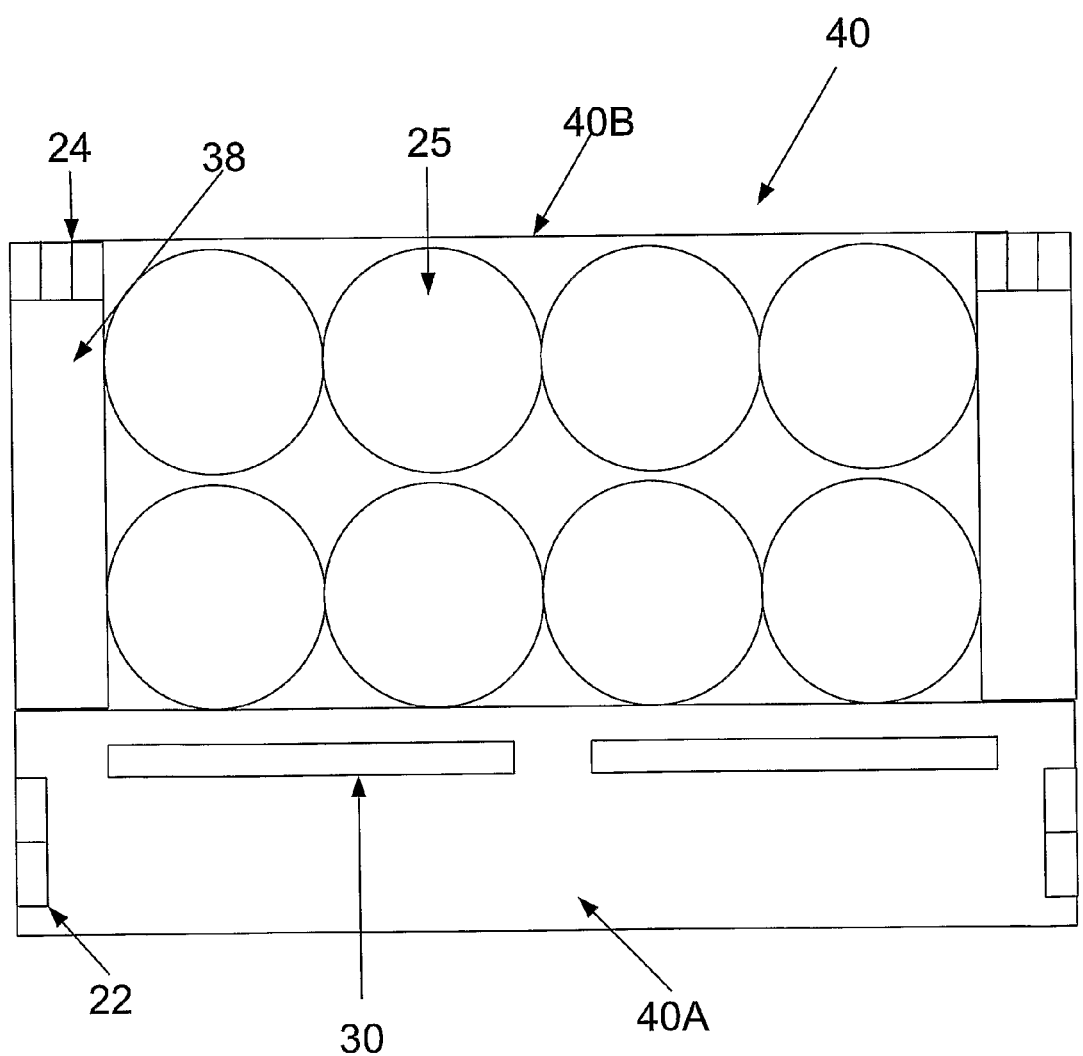
FIG. 6 is a schematic section view of a module according to a second embodiment of the present invention.

FIG. 6 is a schematic section view of a module 40 according to a second embodiment of the present invention. The general function of the module 40 is the same as the function of the module 14 as described in e.g. FIG. 4. Therefore reference numerals for features that are essentially corresponding to the ones previously described are the same, e.g. holes 30, fans 25 and connectors 22, 24. This also applies to further embodiments described below.

Further the power (front) part 40A and the fan assembly 40B corresponds to the power part 14A and the fan assembly 14B, respectively. The main differences between the second embodiment and the previous one, is that front part 40A and the part 38 that includes the connector 24, i.e. the connector part (or rear part), no longer is separated by a fan assembly 40B and is instead arranged at the left and right sides of the module 40. This means that no separate cables or busbars must be drawn within the interior of the fan assembly 40B. The total area of the fan assembly 40B can also be made larger than that of the previous embodiment, leading to a higher total cooling effect. However, even though the pressure equalizing section 32 is located between the fans 25 and the cards in the card cage 20 that is to be cooled, this embodiment may lead to a slightly worse cooling of the cards that are positioned to the far left and right of the card cage 20.

Figure 7:
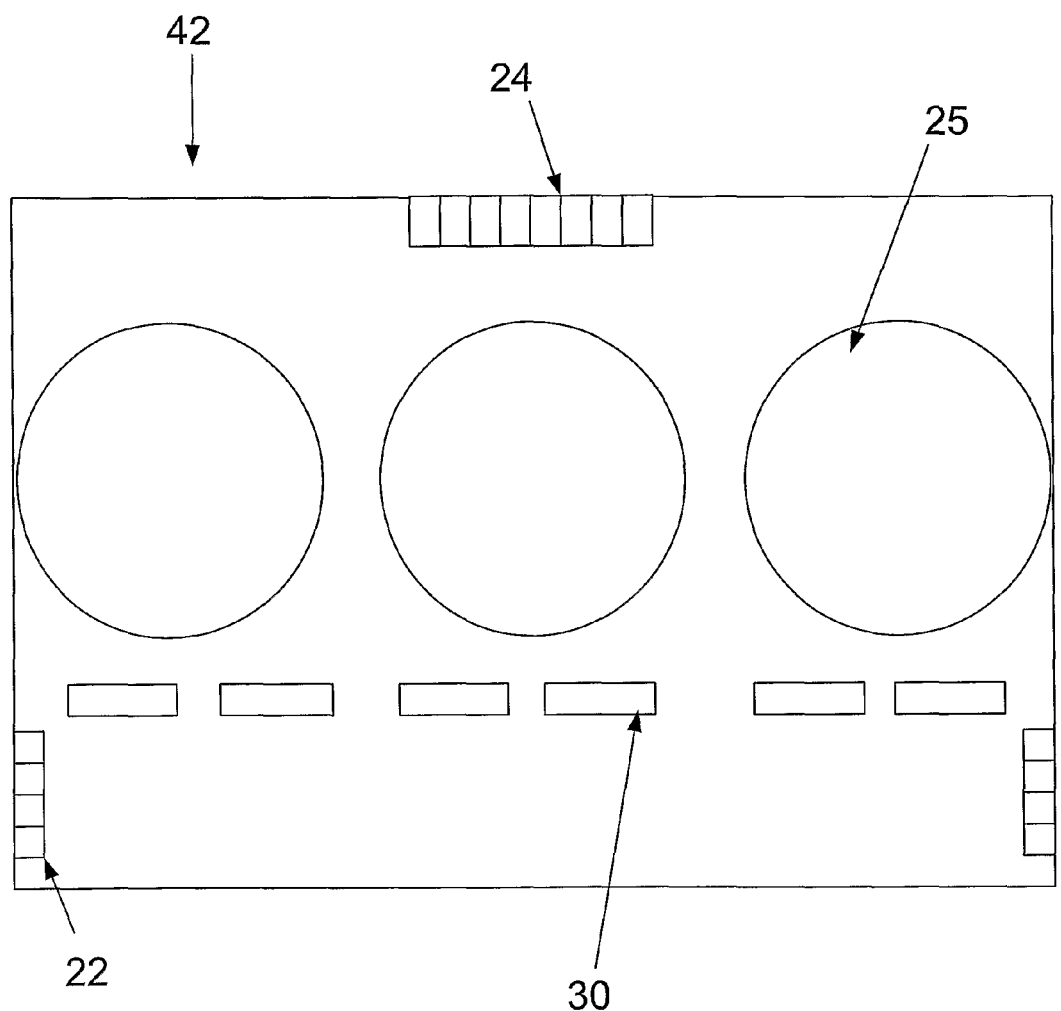
FIG. 7 is a schematic section view of a module according to a third embodiment of the present invention.

FIG. 7 is a schematic section view of a module 42 according to a third embodiment of the present invention. The main difference between the third embodiment and the previous ones is that the module 42 is construed of essentially one part instead of a plurality of parts. The module 42 comprises a continuous board where the fans 25 are provided in holes that have been punched or similar in the board. This solution means that no separate cables or busbars must be drawn between different parts; all connections can be arranged on one common, continuous part. Further the fans can be spread over essentially the entire width of the module 42 resulting in a close to optimal cooling of the subrack 10.

Figure 8:
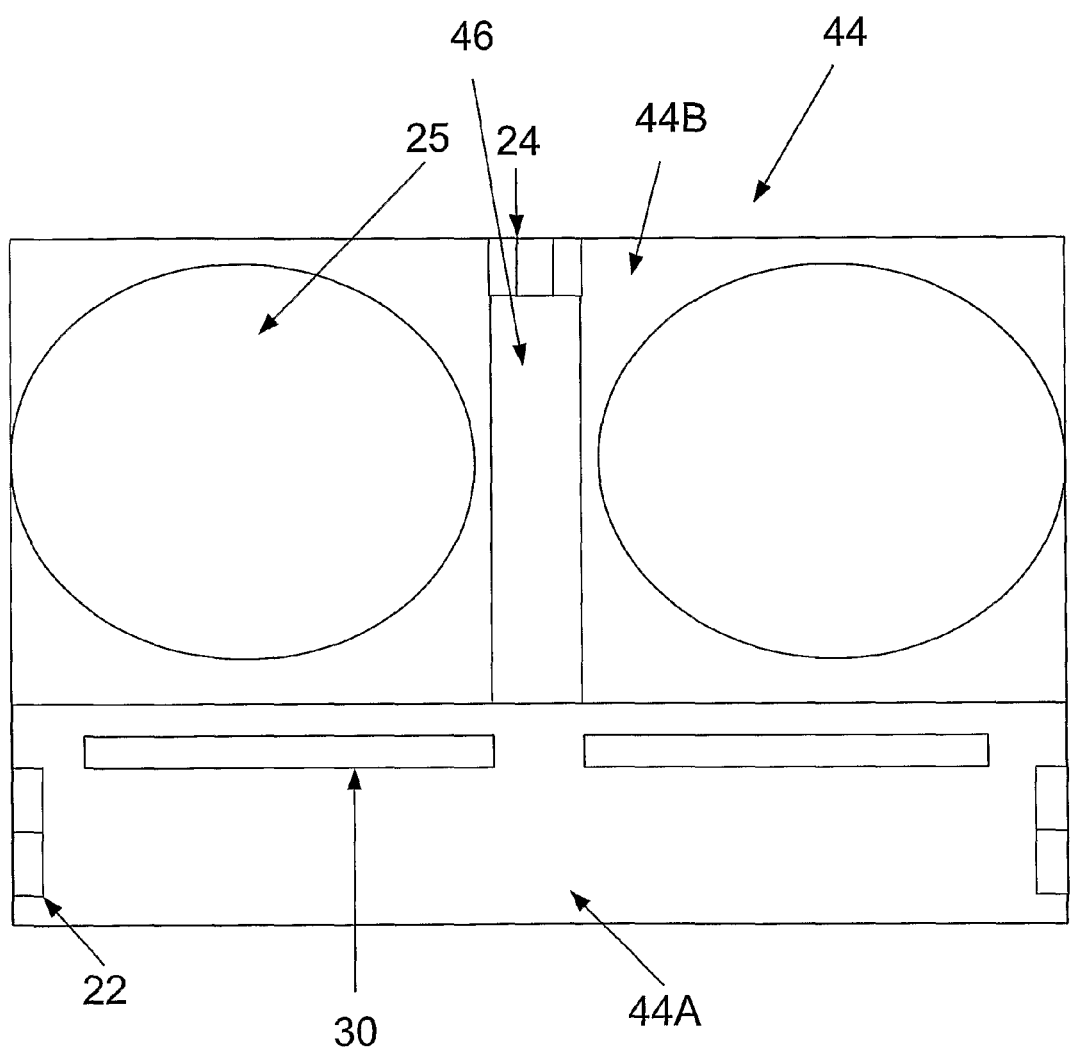
FIG. 8 is a schematic section view of a module according to a fourth embodiment of the present invention.

FIG. 8 is a schematic section view of a module 44 according to a fourth embodiment of the present invention. The power/front part 44A corresponds to the power/front parts 14A and 40A. The fan assembly 44B, in principal, correspond to the fan assembly 14B and 40B, however in this embodiment the fan assembly 44B consist of two separate fan assemblies divided by the connector part 46, corresponding to the connector part 38. Compared to the second embodiment, this embodiment provides an excellent cooling of the cards that are positioned to the far left and right of the card cage 20. Since the centrally located cards receive cooling from fans positioned on both sides of the cards (left and right), these centrally located cards should not be as exposed to overheating as the cards located to the far left and right in the second embodiment. If additional fans and fan assemblies 44B are considered, further connector parts 46 can be arranged between these additional fan assemblies 44B, shortening the distance between the fan assemblies 44B resulting in an evenly spread air cooling.

In the shown embodiments the modules 14 are horizontally arranged and the cards in the card cage are vertically arranged. An alternative would be to arrange the cards horizontally and arrange the modules vertically and on the left and/or right sides of the card cage. There are however some drawbacks with this solution. E.g. the width of the subrack is bigger than the height of the card cage leading to smaller space for the power part unless the module protrudes significantly from the subrack.

The invention claimed is:

1. A module for a telecommunication subrack, the module being configured to be removably mounted in the subrack, the module comprising:
    a power part disposed in a front of the module for securing a power feed to a backplane of the subrack and comprising one or more input connectors for accommodating power cables for the subrack;
    a connector part disposed in a rear of the module and comprising one or more output connectors for connecting the module to the backplane; and
    a fan assembly disposed between the power part and the connector part and comprising one or more fan assemblies for cooling of the subrack.

2. A module according to claim 1 wherein all connections between various parts of the module are within an interior of the module.

3. A module according to claim 1 wherein the module is configured to be horizontally mounted in the subrack.

4. A module according to claim 1 wherein the module has an enclosure made of metal sheets.

5. A module according to claim 1 wherein the power part comprises one or more ventilation openings provided in a bottom thereof, the ventilation openings being configured so that ventilation air can enter a front of the power part and exit the power part via the ventilation openings.

6. A module according to claim 1, further comprising:
    power cables disposed in an interior of the fan assembly that provide a power connection between the power part and the connector part.

7. A module according to claim 1, further comprising:
    busbars disposed in an interior of the fan assembly that provide a power connection between the power part and the connector part.

8. A module according to claim 1 wherein the power part, the one or more input connectors for accommodating power cables, the one or more fan assemblies and the one or more output connectors for connecting the module to the backplane are disposed on one common circuit board.

9. A telecommunication subrack, comprising:
    a cage configured to accommodate cards;
    an air intake provided with a filter;
    two or more removably mounted modules, each of the modules comprising:
        a power part disposed in a front of the module for securing a power feed to a backplane of the subrack and comprising one or more input connectors for accommodating power cables for the subrack;
        a connector part disposed in a rear of the module and comprising one or more output connectors for connecting the module to the backplane; and
        a fan assembly disposed between the power part and the connector part and comprising one or more fan assemblies for cooling of the subrack;
    the backplane configured to distribute power and signaling to the cards and having input connectors for connecting to said two or more modules.

10. A telecommunication subrack according to claim 9 wherein two or more of the modules are arranged adjacent to each other.

11. A telecommunication subrack according to claim 9 wherein the modules are horizontally arranged.

12. A module for a telecommunication subrack, the module being configured to be removably mounted in the subrack, the module comprising:
    a power part disposed in a front of the module for securing a power feed to a backplane of the subrack and comprising one or more input connectors for accommodating power cables for the subrack;
    a fan assembly disposed behind the power part and comprising one or more fan assemblies; and
    a connector part disposed in a rear of the module and to a left side and/or a right side of the fan assembly, the connector part extending from the power part to the rear of the module and comprising the one or more output connectors for connecting the module to the backplane.

13. A module for a telecommunication subrack, the module being configured to be removably mounted in the subrack, the module comprising:
    a power part disposed in a front of the module for securing a power feed to a backplane of the subrack and comprising one or more input connectors for accommodating power cables for the subrack;
    a plurality of fan assemblies disposed behind the power part and each of the fan assemblies comprising one or more fans; and
    one or more connector parts disposed in a rear of the module and between the fan assemblies, the one or more connector parts extending from the power part to the rear of the module and comprising the one or more output connectors for connecting the module to the backplane.

14. A module according to claim 13, wherein the power part and the one or more connector parts are disposed on one common circuit board.

* * * * *